(12) United States Patent
Khatibi et al.

(10) Patent No.: US 11,643,717 B2
(45) Date of Patent: May 9, 2023

(54) HIGH PERFORMANCE TOOL COATING FOR PRESS HARDENING OF COATED AND UNCOATED ULTRAHIGH STRENGTH STEEL SHEET METALS

(71) Applicant: Oerlikon Surface Solutions AG, Pfäffikon, Pfäffikon (CH)

(72) Inventors: Ali Khatibi, Chur (CH); Hamid Bolvardi, Selzach (CH); Etienne Billot, Kerpen (DE); Nikolas Schaal, Thalwil (CH); Pascal Schaback, Buchs (CH); Mirjam Arndt, Wetzlar (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/427,872

(22) PCT Filed: Feb. 3, 2020

(86) PCT No.: PCT/EP2020/052620
§ 371 (c)(1),
(2) Date: Aug. 2, 2021

(87) PCT Pub. No.: WO2020/157332
PCT Pub. Date: Aug. 6, 2020

(65) Prior Publication Data
US 2022/0106677 A1    Apr. 7, 2022

Related U.S. Application Data

(60) Provisional application No. 62/799,965, filed on Feb. 1, 2019.

(51) Int. Cl.
*B32B 15/04* (2006.01)
*C23C 14/06* (2006.01)
(Continued)

(52) U.S. Cl.
CPC ........ *C23C 14/0641* (2013.01); *B21D 22/022* (2013.01); *C23C 14/0057* (2013.01);
(Continued)

(58) Field of Classification Search
CPC .................. B23B 27/14; B23B 27/148; C23C 14/0641; C23C 14/0664; C23C 14/165; C23C 14/34; C23C 28/044; C23C 28/048; C23C 28/42
(Continued)

(56) References Cited

U.S. PATENT DOCUMENTS

| 9,243,310 B2 * | 1/2016 | Cha ...................... C23C 14/3464 |
| 2009/0155559 A1 * | 6/2009 | Xu ......................... C23C 28/042 428/457 |
| 2014/0234582 A1 * | 8/2014 | Honda .................... C23C 28/42 428/141 |

(Continued)

FOREIGN PATENT DOCUMENTS

| EP | 2762248 A1 | 8/2014 |
| EP | 3181729 A1 | 6/2017 |

(Continued)

*Primary Examiner* — Lauren R Colgan

(57) ABSTRACT

A coated tool for hot stamping of coated or uncoated sheet metals, comprising a coated substrate surface to be in contact with the coated or uncoated metal sheet, wherein the coating in the coated substrate surface comprises one or more inferior layers and one or more superior layers, where the inferior layers are deposited closer to the substrate surface than the superior layers, and:
   the inferior layers are designed for providing load bearing capacity,
   the superior layers are designed for providing galling resistance,
   at least one superior layer is deposited having a multi-nanolayer structure wherein:
   one type of nanolayer is composed of at least 90 at.-% of chromium and nitrogen,
(Continued)

a second type of nanolayer is composed of at least 90 at.-% of titanium, aluminum and nitrogen, a third type of nanolayer is composed of at least 90 at.-% of vanadium carbon and nitrogen.

16 Claims, 2 Drawing Sheets

(51) Int. Cl.
| | |
|---|---|
| *B21D 22/02* | (2006.01) |
| *C23C 14/00* | (2006.01) |
| *C23C 14/16* | (2006.01) |
| *C23C 14/34* | (2006.01) |
| *C23C 14/35* | (2006.01) |
| *C23C 28/04* | (2006.01) |

(52) U.S. Cl.
CPC ........ *C23C 14/0664* (2013.01); *C23C 14/165* (2013.01); *C23C 14/34* (2013.01); *C23C 14/35* (2013.01); *C23C 28/044* (2013.01); *C23C 28/048* (2013.01)

(58) Field of Classification Search
USPC .......................................... 428/697, 698, 699
See application file for complete search history.

(56) References Cited

U.S. PATENT DOCUMENTS

| | | | | |
|---|---|---|---|---|
| 2015/0152561 | A1* | 6/2015 | Kang | C23C 28/027 428/698 |
| 2015/0211105 | A1* | 7/2015 | Schier | C23C 28/042 428/141 |
| 2015/0307998 | A1* | 10/2015 | Ahn | C23C 28/042 428/212 |
| 2017/0145556 | A1* | 5/2017 | Andersson | C04B 41/89 |
| 2018/0237922 | A1* | 8/2018 | Khatibi | C23C 14/345 |
| 2018/0245201 | A1* | 8/2018 | Park | C23C 14/548 |
| 2018/0281077 | A1* | 10/2018 | Tanaka | C23C 14/0641 |
| 2018/0369927 | A1* | 12/2018 | Nishizawa | B23B 27/148 |

FOREIGN PATENT DOCUMENTS

| | | | |
|---|---|---|---|
| JP | 2005-177952 | * | 7/2005 |
| WO | 2015007391 A2 | | 1/2015 |

\* cited by examiner

HIGH PERFORMANCE TOOL COATING FOR PRESS HARDENING OF COATED AND UNCOATED ULTRAHIGH STRENGTH STEEL SHEET METALS

TECHNICAL FIELD

The present invention relates to a coating to be applied on surfaces of tools, especially forming tools (within the text also referred to as dies), which are used for press hardening, also known as hot stamping, of AlSi- or Zn-coated and uncoated sheet metals of e.g. ultrahigh strength steel (UHSS) of which the most common type is 22MnB5 USIBOR. Within this document the WorldAutoSteel format is used to define the different types of steel, such as UHSS, AHSS or LSS. Said document uses the metallurgy type, minimum yield strength (MPa) and minimum tensile strength (MPa) in order to identify the different types of steel. Generally, steels with yield strength levels exceeding 550 MPa and tensile strengths exceeding 780 MPa are referred to as UHSS. A forming tool is a tool or machine accessory so shaped, that it imparts a predetermined contour or profile to a workpiece, thereby the workpiece is reshaped without adding or removing material, and its mass remains unchanged. Furthermore, the present invention relates to a method to apply the inventive coating to a substrate.

STATE OF THE ART

Use of advanced high strength steels (AHSS) and UHSS in automotive industry has been steadily increased over the past decades. AHSS are a series of high-strength steels containing microstructural phases other than ferrite, pearlite, or cementite—for example martensite, bainite, austenite, and/or retained austenite in quantities sufficient to produce unique mechanical properties. Most AHSS have a multi-phase microstructure, and typically their yield strength level exceeds 550 MPa. Using such types of steels in making the structural parts of a car (e.g. in so called "Body-In White" (BIW) or chassis) results in a considerable decrease of the total weight of a car, as in this case the above-mentioned structural parts can be produced by using thinner sheet metals while maintaining a high level of strength. An obvious advantage is the production of cars, which have lower fuel consumption and at the same time are safer in the event of an accident, as UHSS have considerably higher absorption of impact energy compared to the low strength steels (LSS). LSS is a group of steel exhibiting a tensile strength below 270 MPa, examples of which are interstitial-free and mild-steels.

However forming the UHSS and AHSS sheet metals is challenging and results in massive wear of the forming dies, particularly in continuous abrasive wear of the dies and/or adhesive wear, e.g. in massive material transfer from the sheet metals to the surface of the dies. In both cases, the quality of the produced parts is considerably affected. In order to maintain the quality of the manufactured parts, frequent maintenance intervals of the forming dies are required. Generation and development of fatigue cracks in the die can reduce the lifetime of an expensive die considerably. This results in lower productivity and excessive production costs.

In cases of using cold forming processes, one way to minimize the damage on the die is to use different surface treatments, which can improve the performance of the forming dies. One of the most common and industrially practical techniques is to use different nitriding methods like plasma or low-pressure nitriding in order to harden the surface of the tool. This is done via diffusion of nitrogen into the sub-surface areas of the steel, resulting in an improved resistance to abrasive wear, and in many cases also adhesive wear. Additionally, through the introduction of compressive stress to the surface, resistance to fatigue cracks is increased. The compressive stress arises due to volume changes resulting from the introduction of nitrogen and/or carbon, and due to thermal effects. As an alternative solution, several hard and wear resistant coatings based on nitrides, carbides, oxides or a combination of them have been developed and industrially used. Use of these coatings in their alone-standing or combined with nitriding solutions could considerably increase the performance of forming dies used in cold forming of for example uncoated HSS and UHSS sheet metals or sheet metals, whose total strength to be attained is not so high (e.g. lower than 1000 MPa).

The Swedish company Plannja presented a forming process, called press hardening or hot stamping to be used for example for forming of coated sheet materials or for forming of sheet materials in general, whose total strength to be attained is higher than 1000 MPa (e.g. between 1000 MPa and 2000 MPa or between 1250 MPa and 2000 MPa). In this kind of forming process, a glowing hot steel sheet is formed and quenched simultaneously in the same die. The whole forming process, including the quenching step, is done in few seconds, e.g. 8-12 seconds. As a result of such fast quenching of the hot formed product part, a martensitic structure is formed, exhibiting a total strength of up to 2000 MPa. In the past few years, the use of such press-hardened steel (PHS) parts in automotive industry, such as e.g. A and B pillars, bumpers, roof and rocker rails, tunnels, and others, has dramatically increased from 3 Mio in 1987 to 250 Mio in 2015.

Some advantages of using hot stamping processes compared to the cold forming processes, are:
- an elimination of springback, which is usually seen in cold-stamped AHSS sheets,
- a one-step forming process,
- and excellent weldability of the PHS parts due to the use of low-carbon alloys.

In order to avoid corrosion of the PHS parts, the sheet materials are usually coated with AlSi- or Zn-coatings before conducting hot stamping processes, However, some difficulties arise when using this process. The level of adhesive and abrasive wear of the dies in a hot stamping process is remarkably higher than those occurring in a cold forming process. One reason is the high forming temperature of about 800° C. as well as a very high quenching rate of >27 degrees/sec. It means, that the sheet material experiences a very fast change of temperature (e.g. a change from a temperature of about 800° C. or more to a temperature of about 150° C. in about 20 seconds or less), while during this change of temperature, the sheet material remains in contact with the die (forming tool) being used for forming it. It is believed that the high forming temperature results in a contact between the die and semi-molten AlSi or Zn coating of the coated sheet material (e.g. USIBOR sheet), leading to a considerable material transfer from the sheets to the surface of the die. Also, high quenching rates result in the formation of a very hard AlSiFeO layer on the surface of the produced parts, which causes abrasive wear of the die. Another common failure mode of the coated dies in a hot stamping process is a process called galling. Galling is a type of wear caused by adhesion between sliding surfaces. When a material galls, some of it is pulled with the contacting surface, especially if there is a large amount of force compressing the surfaces together. Galling is caused by a combination of friction and adhesion between surfaces, followed by slipping and tearing of crystal structure. Galling first leads to an accumulation of material on the forming tool, and eventually results in a detachment of the accumulated material, including parts of the forming tool, such as parts of the coating.

Problem to be Solved

There is a need to find a solution for conducting hot stamping processes, avoiding failure of the forming tools. which adequately increases the resistance of a forming tool against abrasive and adhesive wear at temperatures up to 800° C. and higher, in particular temperatures over 700° C. Coatings increasing the resistance against abrasive wear at a certain temperature range do exist, so do coatings which increase the resistance against adhesive wear in a particular temperature range. It is however challenging to find a coating with a high resistance against abrasive and adhesive wear for temperatures up to 800° C. and even higher, in particular temperatures over 700° C.

Objective of the Invention

An objective of the present invention is to provide a solution for enhancing performance of forming tools used for hot stamping and thereby increasing tool life time, especially for the case of forming tools used in hot stamping of AlSi- and Zn-coated or uncoated sheet materials (such as USIBOR sheets)

Solution of the Problem According to the Present Invention—Description of the Present Invention The present invention proposes providing a coating to be used for coating forming tools that are intended to be used in hot forming processes as described in claim 1.

The present invention discloses a coating system providing enhanced adhesive and abrasive wear resistance to be applied to a substrate such as e.g. a steel substrate, but not limited to such, to be used as a forming tool, especially suitable for press hardening processes. The inventive coating system is a multilayer system. It comprises at least one superior layer (hereafter also called top multi-nanolayer or top layer or layer 5 as shown in FIG. 1 and FIG. 5) containing CrN, TiAlN and VCN, but is not limited to such. Said top layer is characterized by a minimal content of carbon in relation to the nitrogen content considering the carbon and nitrogen content profile throughout the layer. This top layer is mainly intended to provide galling resistance. The inventive coating system can comprise additional layers, in particular, at least one layer for providing the necessary load bearing capacity, which is needed for resisting the combination of mechanical load and thermo-shock during the step of forming and quenching in the hot stamping process.

In general further layers can be provided in the coating for attaining further improvements regarding different coating properties, such as adhesion to substrate, cohesivity within the coating structure, hardness (HIT) and elastic modulus (EIT). Furthermore, the coating must be resistant to the temperatures to which it will be typically exposed during hot forming process as mentioned above. Therefore some tests were carried out at temperatures that can typically occur in hot stamping processes as could be shown in various tests (temperatures between 800° C. and 950° C.).

The inventive coating system can preferably be deposited using a PVD method, such as e.g. cathodic arcing or magnetron sputtering.

DESCRIPTION OF FIGURES

| FIG. 1 | Schematic illustration of one embodiment of the inventive coating system |
|---|---|
| FIG. 2 | Schematic illustration of one possible method to deposit one embodiment of the inventive coating system |
| FIG. 3 | Left: Scanning Electron Microscope (SEM) micrograph of the coating of invention taken by BSE Right: InLens detector SEM micrograph of the coating of invention |
| FIG. 4 | Schematic illustration of how a PVD coated ball oscillates inside the AlSi layer on top of the USIBOR sheet throughout the high-temperature SRV test |

IMPLEMENTATION OF THE PRESENT INVENTION

Figure 1:
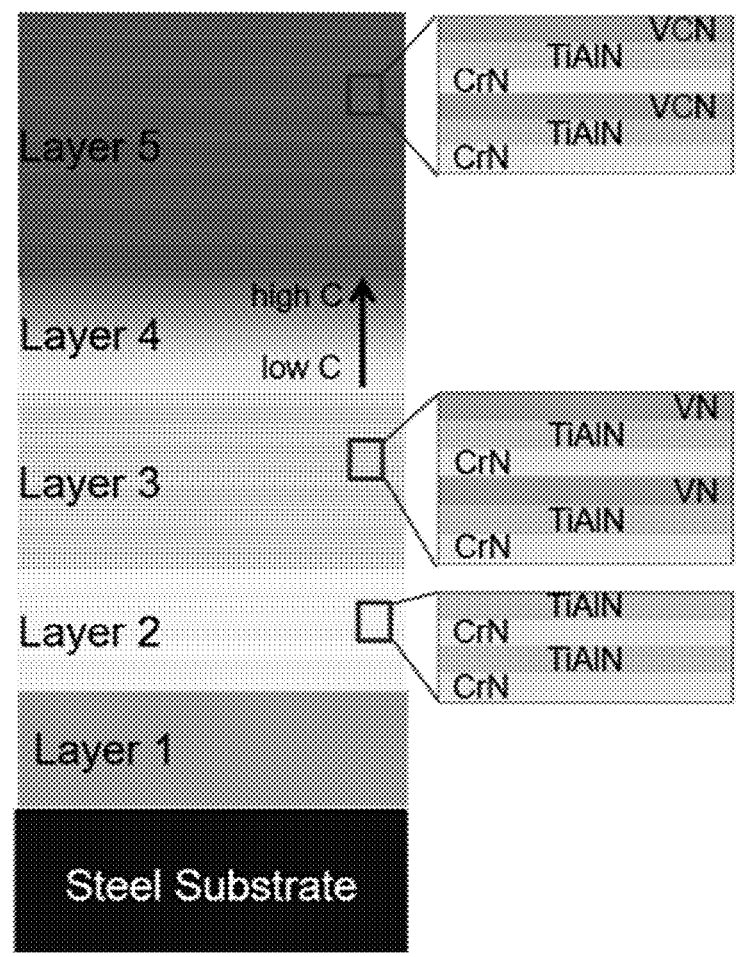

An inventive coating system to be applied to a forming tool used in press hardening, is presented. Said coating can be either a monolayer or multilayer coating, which is then deposited on the surface of a substrate, e.g. a steel substrate related to forming tools and forming members. The inventive coating system comprises at least one layer (within this text referred to as top layer or layer 5).

The top layer itself (Layer 5 in FIG. 1) is a multilayer (also called as upper multilayer), preferably a multi-nanolayer system (in the context of the description of the present invention also referred to as top layer stack). The top layer stack is made of at least three different kind of layers, e.g. layers of the type A, layers of the type B and layers of the type C deposited forming a sequence . . . A/B/C/A/B/C/A . . . .

According to a preferred embodiment of the present invention the top layer stack is deposited formed of layers of the type A mainly comprising chromium nitride or consisting of chromium nitride CrN, layers of the type B mainly comprising titanium aluminum nitride or consisting of titanium aluminum nitride TiAlN, and layers of the type C mainly comprising vanadium carbonitride or consisting of vanadium carbonitride VCN.

Especially good results were attained by using inventive coatings having top layer stack comprising layers of CrN, TiAlN and VCN.

Hence, a top layer stack is preferably designed having layers A, B and C consisting of CrN, TiAlN and VCN, respectively.

In such a case, preferably the layer of the top layer stack being closest to the substrate is a layer comprising CrN, followed by a layer comprising TiAlN, again followed by a layer comprising VCN.

The invention should however not be understood as being limited to the here described preferred embodiments.

The top layer stack of the inventive coating system has to comprise at least one layers-set. A layers-set in the context of the present invention should be understood as a sequence formed of three single layers: one A layer, one B layer and one C layer deposited in succession.

It is important to note that by depositing single layers A, B and C in succession as mentioned above, it is possible that an interface can be formed between two single layers deposited in contact one to each other. A such interface between two single layers can comprise elements of both of the two single layers. For example, it is possible that by depositing a B layer on an A layer, a kind of interface layer between the respective A layer and B layer is formed comprising elements from the A layer as well as from the B layer. It would depend on the kind of coating process used for the deposition of the top layer stack.

Preferably and especially preferably in the case that the thickness of the single layers A, B and C are in nanometer range, the top layer stack should contain a higher amount of layers-sets, typically between 25 and 600 layers. The total coating thickness of the top layer stack should be in a range from 0.5 µm to 12 µm, preferably between 2 µm and 7 µm.

The inventors found, that an inventive coating comprising said top layer exhibits very good characteristics considering abrasive and adhesive wear resistance. Furthermore the inventors observed, that the composition of the top layer is very critical in achieving optimum performance in terms of resistance to material transfer from the AlSi or Zn layer on USIBOR sheets to the surface of the tool. In this sense the content of carbon is determined in coexistence of both, buildup resistance and maximum abrasive wear resistance.

In order to improve the adhesion between the top layer and the substrate of the forming tool, an adhesion layer (within this text referred to as layer 1) can be deposited onto the substrate. Said adhesion layer comprises CrN and preferably consists of CrN. It is preferably a monolayer, which is deposited directly onto the substrate. The thickness of this CrN comprising layer is between 100 nm to 3 µm and is preferably chosen to be between 300 nm and 1.5 µm.

By depositing an additional layer comprising CrN and TiAlN, the performance of the inventive coating system can be improved even further. Said layer (within this text referred to as layer 2, or second multilayer, —see FIG. 1) is a multilayer it can be also a multi-nanolayer system (within this text referred also to as CrN/TiAlN stack). The CrN/TiAlN stack, which is deposited preferably on the layer 1 or it can also be deposited directly on the substrate surface. Preferably the layer 2 is deposited beginning deposition with a layer comprising CrN, preferably consisting of CrN. On top of said CrN comprising layer, another layer comprising TiAlN is deposited. Said TiAlN comprising layer preferably consists of TiAlN. The CrN/TiAlN stack can comprise one or more sets formed of two layers (one layer consisting of CrN and one layer consisting of TiAlN).

In other words, the CrN/TiAlN stack comprises at least one CrN/TiAlN set but is not limited to one CrN/TiAlN set. Preferably, between 5 and 130 sets are deposited in order to form the CrN and TiAlN containing layer (layer 2). The thickness of the layer 2 can range from 150 nm to 4 µm and is preferably chosen to be between 600 nm and 3 µm This layer is known to exhibit a good load bearing capacity (it means capacity of supporting the loads applied to the substrate).

The inventors found that inventive coatings comprising not only layer 5 but also containing layers 1 and 2 as described above, are very suitable for stamping processes. Forming tools coated in this manner can exhibit in general good wear resistance in hot stamping processes compared to state of the art coatings.

The resistance of the coating against abrasive and adhesive wear, can be improved even further, by adding two more layers to the system (within this text referred to as layer 3, or third multilayer, and layer 4, or fourth multilayer). Surprisingly the inventors found that within this system, it is beneficial to add a layer (layer 3) containing V and deposit it onto layer 2.

Layer 3 is a nanolayer system (within this text referred to as CrN/TiAlN/VN stack), comprising at least CrN, TiAlN and VN. The CrN/TiAlN/VN stack comprises sets of three layers, which are deposited on top of each other (see FIG. 1). Of said at least three layers, the CrN comprising layer is nearest to the substrate. This layer preferably consists of CrN. On top of this layer, a TiAlN comprising layer is deposited, which preferably consist of TiAlN. On top of this layer, a VN comprising layer is deposited, which preferably consists of VN. In order to form an inventive coating system, at least one set is used to form layer 3. This is however not limiting. Typically between 4 and 80 sets are deposited in order to form the CrN, TiAlN and VN containing layer. The thickness of said layer can range from 20 nm to 4 µm and is preferably chosen to be between 800 nm and 3 µm.

Layer 4 also is a multilayer system, which is built up like layer 3, but carbon is added gradually in order to change the VN layer to a VCN layer, meaning at the lower part of layer 4, the layer exhibits a low carbon content, while at the upper part of layer 4, the layer exhibits a high carbon content. The inventors found, that further improvements of the wear resistance could be achieved by adding a layer of such kind between layer 3 and layer 5.

Layer 4 is a nanolayer system (within this text referred to as CrN/TiAlN/VN stack), comprising at least CrN, TiAlN and VN, wherein carbon is added gradually in order to change the VN layer to a VCN layer. The CrN/TiAlN/VCN stack comprises sets of three layers, which are deposited on top of each other (see FIG. 1). Of said at least three layers, the CrN comprising layer is nearest to the substrate. This layer preferably consists of CrN. On top of this layer, a TiAlN comprising layer is deposited, which preferably consist of TiAlN. On top of this layer, a VCN comprising layer is deposited, which preferably consists of VCN. In order to form an inventive coating system, at least one set is used to form layer 3. This is however not limiting. Typically between 4 and 80 sets are deposited in order to form the CrN, TiAlN and VCN containing layer. The thickness of said layer can range from 20 nm to 4 µm and is preferably chosen to be between 800 nm and 3 µm.

The inventors also observed that the inventive coating works best, when the substrate of the forming tool is pre-nitrided. The nitriding process can be done either in the same deposition chamber or in a separate one.

In order to clarify the buildup of the inventive coating system, it will now be described by embodiments. An embodiment of the invention will be described by way of example, which is meant to be merely illustrative and therefore non limiting.

According to one preferred embodiment of the present invention, which is shown in FIG. 1, the multilayer system consists of five different layers, which are deposited on the substrate of a forming tool. A CrN layer (in this embodiment referred to as layer 1) is deposited directly on the substrate. On top of layer 1, a layer (in this embodiment referred to as layer 2) consisting of CrN and TiAlN is deposited. On top of the layer 2, a layer (in this embodiment referred to as layer 3) consisting of CrN, TiAlN and VN is deposited. On top of layer 3, a layer (in this embodiment referred to as layer 4) consisting of CrN, TiAlN and VCN with a gradient carbon content profile is deposited on layer 3. The top layer (in this embodiment referred to as layer 5) consists of CrN, TiAlN an VCN, with a constant carbon content throughout the layer. The overall thickness of the coating described in this embodiment can range from 4 µm to 20 µm.

The sum of the coating thickness of layers 4 and 5 preferably accounts for 40% to 50% of the total coating thickness, but is not limited to this amount. As can be seen the layers 4 and 5 are carbonitride layers.

Layer 4 is a transition layer from a pure nitride layer (third layer) to a carbonitride layer (fifth layer). Therefore the level of carbon increases and the level of nitrogen decreases over the thickness of the layer 4, as the distance of layer 4 from the substrate increases. In this regard layer 4 is a compound of $(Cr_aTi_bAl_cV_d)_\lambda(C_xN_y)_\delta$ in which x and y are preferably adjusted as follows: $0 \leq x \leq 0.33$ and $0.67 \leq y \leq 1$. The metal (i.e. the content sum of Cr, Ti, Al and V) to non-metal (i.e. the content sum of C and N) ratio is preferably chosen to be $0.72 \leq \lambda/\delta \leq 1.27$. Also, the content of individual metallic elements of Cr, Ti, Al, and V are preferably adjusted as follows: $0.20 \leq a \leq 0.30$, $0.05 \leq b \leq 0.15$, $0.15 \leq c \leq 0.25$, and $0.40 \leq d \leq 0.50$ with $a+b+c+d=1$, preferably $0.20 \leq a \leq 0.30$, $b=0.10$, $c=0.20$, and $0.40 \leq d \leq 0.50$ with $a+b+c+d=1$.

Layer 5 is a carbonitride compound with a constant composition of $(Cr_aTi_bAl_cV_d)_\lambda(C_xN_y)_\delta$ with $0.4 \leq x/y \leq 0.6$ and $0.65\lambda/\delta \leq 1.1$, preferably $x/y=0.5$, and $\lambda/\delta=0.72$. The content of individual metallic elements of Cr, Ti, Al, and V are chosen as follows: $0.20 \leq a \leq 0.30$, $0.05 \leq b \leq 0.15$, $0.15 \leq c \leq 0.25$, and $0.40 \leq d \leq 0.50$, preferably, $a=0.20$, $b=0.10$, $c=0.20$, and $d=0.50$.

Layers 1, 2 and 3 are compounds of nitride layers. These layers are stoichiometric nitrides with a metal-to-non-metal ratio of 1.

Figure 2:
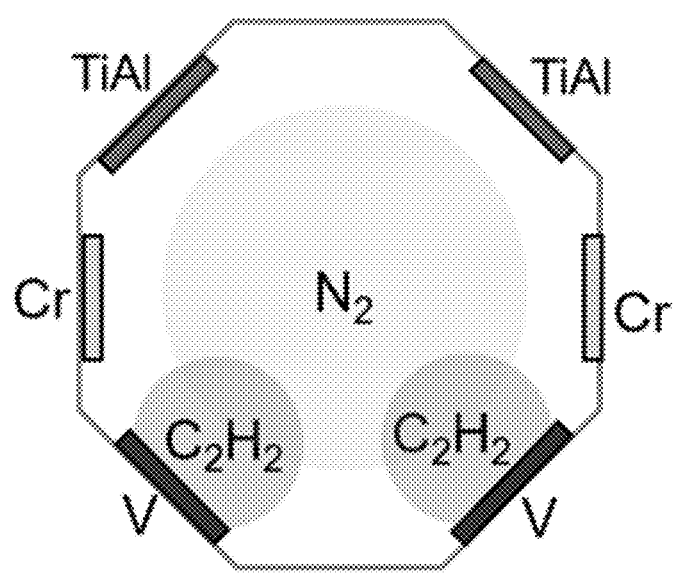

In order to deposit the coating system described in this embodiment, three different target materials of Cr, TiAl, and V were used in an Oerlikon Balzers INNOVA deposition chamber, as shown in FIG. 2. Besides the elemental Cr and V target materials, the TiAl target was powder metallurgically prepared, in order to exhibit an Al to Ti weight ratio of ~2. In order to produce the layers 1 to 3, pure nitrogen gas was present in the chamber. On the transition to layer 4, acetylene gas was additionally purged into the chamber. The flow of acetylene was increased gradually while the level of nitrogen gas was remained constant. Since acetylene gas shows a very high reactivity, the gas has to be introduced into the chamber as close as possible to the substrate to be coated. Since the aim was to generate a high carbon content within the coating, the acetylene gas was released in the immediate vicinity of the substrate. The same would hold true for O, which also shows a high reactivity. The situation is however different for N, which can be introduced into the chamber without such specialized arrangements, since it is less reactive than acetylene gas. Said method resulted in a gradient layer 4 starting as pure nitride and ending as a carbonitride. The flow of acetylene gas was remained constant through the whole layer 5, so a carbonitride layer with constant composition was formed as a top layer. In order to form a coating with the desired structure and properties, a negative substrate bias of 60 V was used through the first three layers. The negative substrate bias was increased to 100 V during the gradient layer 4. It remained constant at −100 V through layer 5.

Figure 3:
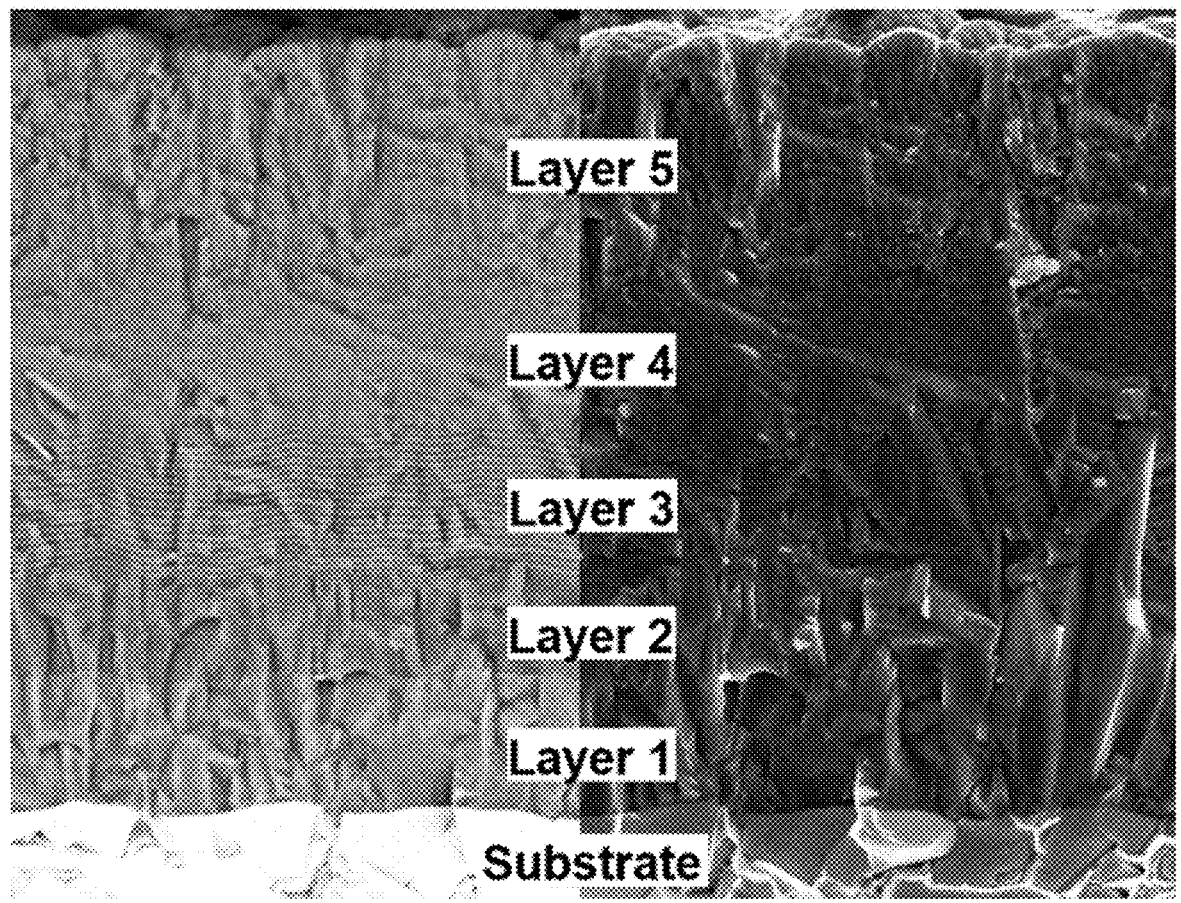

In the framework of the present invention, properties and structure of the coating solution described in this embodiment were tested. Scanning Electron Microscopy (SEM) micrographs taken with the conventional method as well as the In-Lens method are shown in FIG. 3. On top of the bottom layer 1 which is a dense, featureless CrN layer, a nanolayer of CrN/TiAlN was deposited. The hardness (HIT) and elastic modulus (EIT) of this layer were ~27 GPa and 300 GPa, respectively. The bilayer period of this nanolayer is measured as 35 nm. In layer 3, a nanolayer of CrN/TiAlN/VN is deposited. The mechanical properties of this layer are measured as 29 GPa for HIT and 340 GPa for EIT. The total thickness of all three nanolayers together is estimated as 55 nm. Finally, the top C-containing layers of 4 and 5 have HIT and EIT of 24 GPa and 250 GPa, respectively. Presence of C in these two layers have resulted in a refinement of the nanolayer structure, in a way that the thickness of three CrN/TiAlN/VCN is decreased to half ~22 nm.

Figure 4:
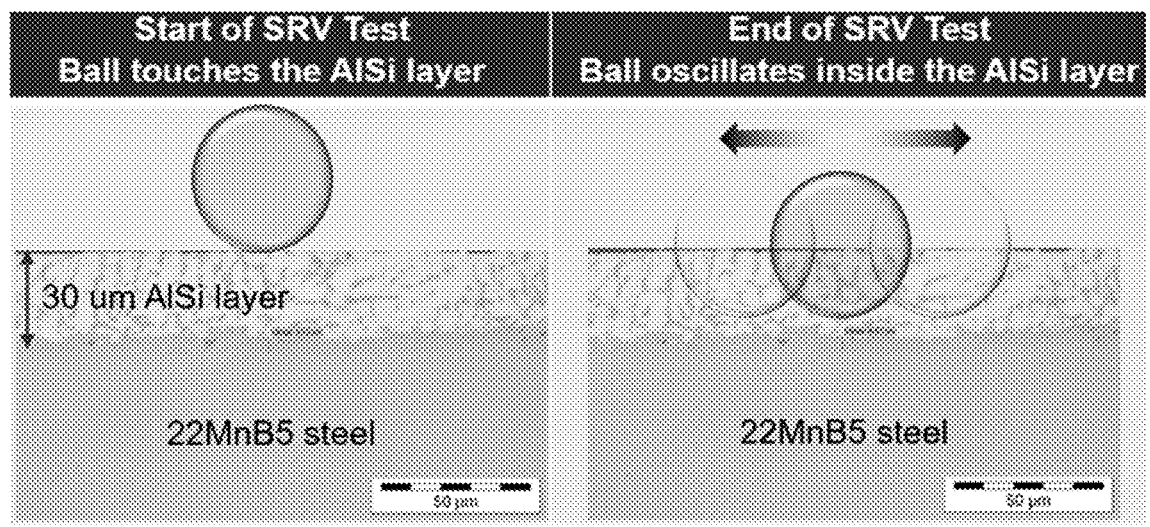

The resistance of the coatings to adhesive wear, which is defined as the transfer and buildup of AlSi or Zn from the coated USIBOR sheets to the surface of the PVD coating, is measured with an innovative testing method in an SRV tester at high temperatures of ~730° C. In this innovative method, a 100Cr6 steel ball with a diameter of 10 mm was coated with an inventive PVD coating. As the counterpart, a round-shaped AlSi-coated USIBOR sheet, which was cut in a diameter of 21 mm was fixed in a holder suitable for use at high temperatures. The USIBOR sheet was then heated up through a resistively heated table, which was in contact with the sheet holder. The temperature on the glowing USIBOR sheet was measured via a secondary thermocouple as 730° C. compared to the setpoint temperature of the SRV tester, which was 900° C. The achieved temperature of 730° C. on the USIBOR sheet was high enough to bring the AlSi layer to its semi-liquid level, identical to the real practice in industrial application and suitable for the buildup resistance studies. In order to represent the real conditions of the AlSi-USIBOR hot stamping application, testing parameters such as the contact time between ball and USIBOR sheet, applied vertical force on the ball, and its vibrational frequency were adjusted in a way, which ensures that the coated ball is always within the depth of the AlSi layer and never touches the underlying 22MnB5 steel. In order to fulfill the mentioned requirement, a vertical load of 10N was used. The contact time between the coated ball and the AlSi-coated USIBOR plate was set to 1 min before the next cycle started. A schematic representation of the performed test is shown in FIG. 4. This is done in order to simulate the contact of the coated tool with a new piece of sheet metal in a real hot stamping application. Doing that, the volume and height of the AlSi buildup on any desired PVD coating was measured using a 3D confocal Nanofocus microscope resulting in a quantitative and qualitative assessment of the buildup resistance of that coating. Depending on the performance of the tested coatings, this process could be repeated up to 20 times on the same spot on a coated ball, followed by the Nanofocus microscopy measurements. Using this unique testing method, the coating of invention showed an order of magnitude less buildup volume compared to conventional state-of-the-art AlCrN and TiAlN coatings deposited by identical PVD method.

The resistance of the coatings to abrasive wear was measured by using a high-temperature pin-on-the-disk tester. The maximum achieved temperature in this test was 800° C. In this regard, an inventive PVD coating was applied to a round-shaped piece of Inconel, which was suitable for high-temperature measurement. Upon reaching the temperature, an abrasive ball made out of aluminum oxide with a diameter of 6 mm would come into the contact with the PVD coated Inconel sample. The linear speed of the ball and its total contact time with the coated sample were 2.64 cm/sec and 10 minutes, respectively. Finally, the profile of the racetrack was measured by using a 3D confocal Nanofocus microscope resulting in the measurement of the wear occurred on the desired PVD coating.

Coated substrate having a coating for providing enhanced abrasive and adhesive wear resistance, wherein the coating has a multilayer structure comprising a multilayer deposited as upper multilayer, characterized in that the upper multilayer is formed by sublayers of the type A, B and C, said three kind of sublayers being deposited alternate one on each other forming a sequence of the type . . . A/B/C/NB/C/A . . . , characterized in that:
the sublayer of the type A is a chromium nitride layer,
the sublayer of the type B is a titanium aluminum nitride layer,
the sublayer of the type C is a vanadium carbonitride layer.

Coated substrate according to the sentence above, characterized in that the substrate is a forming tool.

The invention claimed is:

1. A coated tool for hot stamping of coated or uncoated sheet metals, comprising
a coated substrate surface to be in contact with the coated or uncoated metal sheet, wherein a coating in the coated substrate surface is a multi-layer coating comprising one or more inferior layers and one or more superior layers, wherein the inferior layers are deposited closer to a substrate surface than the superior layers, and the one or more superior layers includes a top layer,
wherein:
the inferior layers are designed for providing load bearing capacity,
the superior layers are designed for providing galling resistance,
the top layer is deposited having a multi-nanolayer structure formed by three kind of sublayers of type A, B and C, said three kind of sublayers being nanolayers deposited alternatingly one on each other forming a sequence of the type . . . A/B/C/NB/C/A . . . , wherein at least two sequences of one A nanolayer, one B nanolayer and one C nanolayer are deposited forming the multi-nanolayer structure
wherein:
the nanolayer of type A is composed of at least 90 at.-% of chromium and nitrogen,
the nanolayer of type B is composed of at least 90 at.-% of titanium, aluminum and nitrogen,
the nanolayer of type C is composed of at least 90 at.-% of vanadium carbon and nitrogen,
and
a layer thickness of the top layer is not lower than 0.5 µm and not higher than 15 µm.

2. The coated tool according to claim 1, wherein a sum of layer thicknesses of three nanolayers A, B, and C forming one sequence is between 15 nm and 300 nm.

3. The coated substrate according to claim 1, wherein in the top layer an average ratio of carbon content fraction, x, between nitrogen content fraction, y, is in a range $0.4 \leq x/y \leq 0.6$, when considering an average chemical element composition in atomic percentage described by $(Cr_aTi_bAl_cV_d)_\lambda (C_xN_y)_\delta$, where the average composition is measured considering a layer thickness extension of at least 100 nm, with coefficients a, b, c and d corresponding to composition fractions of Cr, Ti, Al, V, C and N, in ranges $0.20 \leq a \leq 0.30$, $0.05 \leq b \leq 0.15$, $0.15 \leq c \leq 0.25$, and $0.40 \leq d \leq 0.50$, respectively, with a+b+c+d=1 and x+y=1, and coefficients X and 6 being factors for indication of stoichiometry, where $0.72 \leq \lambda/\delta \leq 1.27$.

4. The coated substrate according to claim 3, wherein in the top layer, the average ratio of carbon content fraction between nitrogen content fraction, x/y, can be considered to be constant because a variation along an overall thickness of the top layer is less than 10% of the maximal value.

5. The coated substrate according to claim 1, wherein an interface is formed between two sublayers deposited in contact one to each other, wherein the interface comprises elements of both of the two sublayers.

6. The coated substrate according to claim 1, wherein the top layer is an upper multilayer that contains between 25 and 600 layers, and wherein a total coating thickness of the top layer is in a range from 0.5 µm to 12 µm.

7. The coated substrate according to claim 6, wherein the one or more inferior layers includes an adhesion layer deposited onto the substrate between the top layer and the substrate, and wherein the adhesion layer comprises CrN.

8. The coated substrate according to claim 7, wherein a second multilayer is deposited onto the substrate between the top layer and the adhesion layer, wherein the second multilayer comprises CrN and TiAlN.

9. The coated substrate according to claim 8, wherein the second multilayer comprises between 5 and 130 sets formed of one layer consisting of CrN and one layer consisting of TiAlN, and wherein a thickness of the second layer ranges from 150 nm to 4 µm.

10. The coated substrate according to claim 8, wherein a third layer is deposited on top of the second layer, and wherein the third layer is a nanolayer system comprising at least CrN, TiAlN and VN.

11. The coated substrate according to claim 10, wherein the third multilayer comprises between 4 and 80 sets in order to form the CrN, TiAlN and VN comprising third layer, wherein a thickness of the third layer ranges from 20 nm to 4 µm.

12. The coated substrate according to claim 10, wherein a fourth layer is deposited on top of the third layer, and wherein the fourth layer is a transition layer from a nitride layer to a carbonitride layer, wherein a level of carbon increases and a level of nitrogen decreases over a thickness of the fourth layer as a distance of the fourth layer from the substrate increases.

13. The coated substrate according to claim 12, wherein the fourth layer is a compound of $(Cr_aTi_bAl_cV_d)_\lambda (C_xN_y)_\delta$ in which x and y are adjusted as follows: $0 \leq x \leq 0.33$ and $0.67 \leq y \leq 1$, in which metal, in particular the a content sum of Cr, Ti, Al and V, to non-metal, in particular a content sum of C and N, ratio is chosen to be $0.72 \lambda / \delta 1.27$, in which the content of individual metallic elements of Cr, Ti, Al, and V are adjusted as follows: $0.20 \leq a \leq 0.30$, $0.15 \leq b \leq 0.25$, $0.15 \leq c \leq 0.25$, and $0.40 \leq d \leq 0.50$ with a+b+c+d=1.

14. The coated substrate according to claim 13, wherein the top layer is a carbonitride compound with a constant composition of $(Cr_aTi_bAl_cV_d)_\lambda (C_xN_y)_\delta$ with $0.4 \leq x/y \leq 0.6$ and $0.65 \leq \lambda/\delta \leq 1.1$, wherein the content of individual metallic elements of Cr, Ti, Al, and V are chosen as follows: $0.20 \leq a \leq 0.30$, $0.15 \leq b \leq 0.15$, $0.5 \leq c \leq 0.25$, and $0.40 \leq d \leq 0.50$.

15. A method for coating a coated substrate according to claim 1, comprising using a PVD method, in particular cathodic arcing or magnetron sputtering, for coating the coated substrate.

16. The method according to claim 15, comprising performing the following steps during coating:
pre-nitriding the substrate in a deposition chamber,
when the one or more inferior layers are produced, pure nitrogen gas is present in the deposition chamber, wherein a negative substrate bias of 60 V is used,
when a superior layer is produced between the one or more inferior layers and the top layer, acetylene gas is additionally purged into the deposition chamber, wherein a flow of acetylene is increased gradually while a level of nitrogen gas is kept constant, wherein a negative substrate bias is increased from 60 V to 100 V, and the flow of acetylene gas is kept constant through the top layer, so that a carbonitride layer with constant composition is formed as the top layer, wherein a negative substrate bias of 100 V is kept constant.

* * * * *

UNITED STATES PATENT AND TRADEMARK OFFICE
CERTIFICATE OF CORRECTION

PATENT NO. : 11,643,717 B2
APPLICATION NO. : 17/427872
DATED : May 9, 2023
INVENTOR(S) : Khatibi et al.

Page 1 of 1

It is certified that error appears in the above-identified patent and that said Letters Patent is hereby corrected as shown below:

In the Claims

Column 9, Line 31, "...A/B/C/NB/C/A..." should read -- ...A/B/C/A/B/C/A... --

Column 9, Line 58, "3 "and coefficients X and 6 being" should read -- and coefficients $\lambda$ and $\delta$ being --

Column 10, Line 41, "0.72$\lambda$/$\delta$1.27" should read -- 0.72$\leq\lambda/\delta\leq$1.27 --

Column 10, Line 43, "0.15$\leq$b$\leq$0.25" should read -- 0.05$\leq$b$\leq$0.15 --

Column 10, Line 50, "0.15$\leq$b$\leq$0.15, 0.5$\leq$c$\leq$0.25" should read -- 0.05$\leq$b$\leq$0.15, 0.15$\leq$c$\leq$0.25 --

Signed and Sealed this
Thirty-first Day of December, 2024

Derrick Brent
*Acting Director of the United States Patent and Trademark Office*